United States Patent
Lee

(10) Patent No.: US 8,338,309 B2
(45) Date of Patent: Dec. 25, 2012

(54) METHOD FOR FORMING DEEP TRENCH IN SEMICONDUCTOR DEVICE

(75) Inventor: Won-Kwon Lee, Chungcheongbuk-do (KR)

(73) Assignee: MagnaChip Semiconductor, Ltd., Chungcheongbuk-do (KR)

( * ) Notice: Subject to any disclaimer, the term of this patent is extended or adjusted under 35 U.S.C. 154(b) by 26 days.

(21) Appl. No.: 12/619,125

(22) Filed: Nov. 16, 2009

(65) Prior Publication Data

US 2010/0159669 A1    Jun. 24, 2010

(30) Foreign Application Priority Data

Dec. 24, 2008    (KR) .............................. 2008-0133892

(51) Int. Cl.
*H01L 21/302*    (2006.01)
(52) U.S. Cl. ........ 438/713; 438/714; 438/715; 438/723; 438/724; 257/E21.257
(58) Field of Classification Search .................. None
See application file for complete search history.

(56) References Cited

U.S. PATENT DOCUMENTS

| | | | |
|---|---|---|---|
| 5,010,241 A | 4/1991 | Butterworth | 235/472 |
| 5,585,615 A | 12/1996 | Iwanami et al. | 235/472 |
| 6,080,637 A * | 6/2000 | Huang et al. | 438/424 |
| 6,318,384 B1* | 11/2001 | Khan et al. | 134/22.1 |
| 6,703,315 B2 | 3/2004 | Liu et al. | |
| 7,473,615 B2* | 1/2009 | Smith et al. | 438/425 |
| 2002/0076915 A1* | 6/2002 | Begley et al. | 438/618 |
| 2004/0266136 A1* | 12/2004 | Jung et al. | 438/437 |
| 2005/0029221 A1* | 2/2005 | Chang et al. | 216/2 |
| 2008/0102639 A1* | 5/2008 | Cho et al. | 438/702 |

* cited by examiner

*Primary Examiner* — Kyoung Lee
(74) *Attorney, Agent, or Firm* — Morgan, Lewis & Bockius LLP

(57) ABSTRACT

A method for forming a deep trench in a semiconductor device includes: forming a hard mask over a substrate, forming a hard mask pattern over the substrate through etching the hard mask to thereby expose an upper portion of the substrate, forming a first trench through a first etching the exposed substrate using a gas containing bromide and a gas containing chloride and forming a second trench through a second etching the first trench using of a gas containing sulfur and fluorine, wherein a depth of the second trench is deeper than a depth of the first trench.

22 Claims, 5 Drawing Sheets

METHOD FOR FORMING DEEP TRENCH IN SEMICONDUCTOR DEVICE

CROSS-REFERENCE TO RELATED APPLICATIONS

The present application claims priority of Korean Patent Application No. 10-2008-0133892, filed on Dec. 24, 2008, which is incorporated herein by reference.

BACKGROUND OF THE INVENTION

1. Field of the Invention

The present invention relates to a method for fabricating a semiconductor device; and, more particularly, to a method for forming a deep trench in a semiconductor device.

2. Description of Related Art

Generally, a Bosch process proposed by Robert Bosch GmbH and a cryogenic process by etching with liquid nitrogen at a very low temperature are used to form a deep trench in a semiconductor device.

Fluorine-based plasma is used to etch a silicon substrate in the Bosch process. The Bosch process is performed by alternately performing a fluorine carbon plasma process in order to increase a mask selection rate and to protect sidewalls of the deep trench. The cryogenic process is similar to the Bosch process but the most different thing from the Bosch process is that it forms a blocking layer in the sidewalls. The blocking layer includes a stacked layer of an oxide layer in a thickness of tens of nanometers and a fluoride layer ($SiO_xF_y$).

The Bosch process and cryogenic process are proper for forming a deep trench in a Micro-Electro-Mechanical System (MEMS) in a depth of tens to hundreds of micrometers. However, since a process for forming the blocking layer and an etching process are alternately performed, a scallop phenomenon where the sidewalls are formed ruggedly is caused. If a width of the trench is broad, the scallop phenomenon may be ignored. However, if the width of the trench is narrow, an under-cut is caused in an upper portion of the trench or space void is formed due to the scallop phenomenon when the trench is buried.

FIG. 1 is a micrograph showing a cross-sectional of a conventional semiconductor device having a deep trench through one-step etching process.

As shown in FIG. 1, in a case that the one-step etching process is performed to form a deep trench, a under-cut and a void are formed in the upper portion and a sidewall of the deep trench.

Therefore, a method for forming a deep trench in a semiconductor device is developed to solve the problems caused by the scallop phenomenon.

SUMMARY OF THE INVENTION

Embodiment of the present invention are directed to providing a method for forming a deep trench, which can prevent an under-cut in an upper portion of the deep trench caused by a scallop phenomenon and thereby improve a burial characteristic of a deep trench.

In accordance with an aspect of the present invention, there is provided a method for forming a deep trench in a semiconductor device, including: forming a hard mask on a substrate; forming a hard mask pattern on the substrate through etching the hard mask to thereby expose an upper portion of the substrate; forming a first trench through a first etching the exposed substrate using a gas containing bromide and a gas containing chloride; and forming a second trench through a second etching the first trench using of a gas containing sulfur and fluorine, wherein a depth of the second trench is deeper than a depth of the first trench.

In accordance with another aspect of the present invention, there is provided a method for forming a deep trench in a semiconductor device, including: forming a hard mask over a substrate; forming a hard mask pattern by etching the hard mask to thereby expose an upper portion of the substrate; forming a first trench in the exposed substrate by performing a first etching process using a gas containing bromide and a gas containing chloride to thereby form a polymer over an etched sidewall of the first trench; forming a second trench have a vertical profile and having a depth deeper than the first trench/through a second etching process where the exposed substrate through a bottom portion of the first trench is etched using a gas containing sulfur hexafluoride and a gas containing an oxygen gas, wherein the first trench has a tilt angle of approximately 70° approximately to 85° between a bottom and the etched sidewall.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

DESCRIPTION OF SPECIFIC EMBODIMENTS

In the figures, the dimensions of layers and regions are exaggerated for charity of illustration. It will also be understood that when a layer (or film) is referred to as being 'on' another layer or substrate, it can be directly on the other layer or substrate, or intervening layers may also be present. Furthermore, it will be understood that when a layer is referred to as being 'under' another layer, it can be directly under, and one or more intervening layers may also be present. In addition, it will also be understood that when layer is referred to as being 'between' two layers, it can be the only layer between the two layers, or one or more intervening layers may also be present.

The advantages, features and aspects of the invention will become apparent from the following description of the embodiments with reference to the accompanying drawings, which is set forth hereinafter. In the description on each embodiment, a semiconductor device, will be described as an example of a semiconductor device. However, the spirit and scope of the present invention are not limited to the semiconductor device.

Hereinafter, a method for fabricating a semiconductor device having a deep trench will be described in detail with reference to the accompanying drawings.

Embodiment

FIGS. 2A to 2H are cross-sectional views illustrating a method for forming a deep trench in a semiconductor device in accordance with an embodiment of the present invention.

Figure 1:
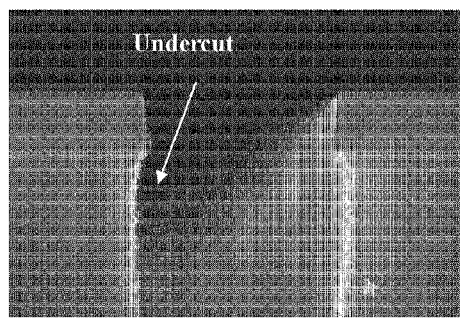
FIG. 1 is a micrograph showing a conventional semiconductor device having a deep trench.
Figure 1:
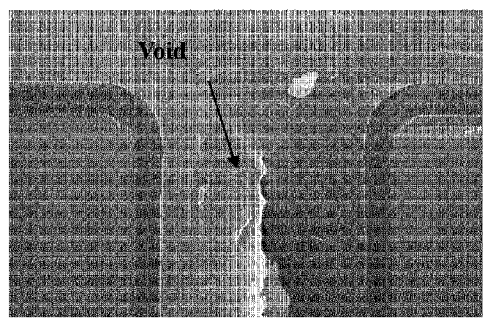
Figure 2A:
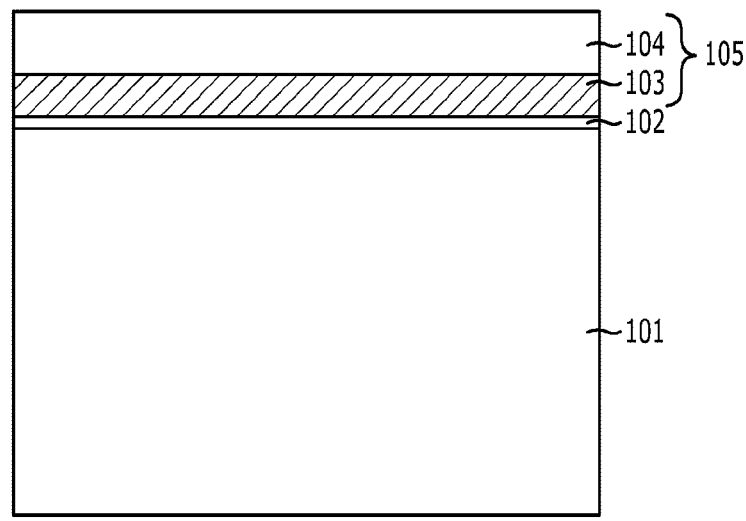
FIGS. 2A to 2H are cross-sectional views illustrating a method for fabricating a semiconductor device having a deep trench in accordance with an embodiment of the present invention.

Referring to FIG. 2A, a buffer layer 102 is formed over a substrate 101. The buffer layer 102 is formed to prevent the substrate 101 from being damaged when a deposition process and a removing process of a nitride layer 103 to be formed through a subsequence process are performed. The buffer layer 102 is formed of a silicon oxide, e.g., $SiO_2$ in a thickness ranging from approximately 100 Å to approximately 200 Å through a dry oxide process, a wet oxide process or an oxide process using radical ions.

Then, a hard mask 105 is formed over the buffer layer 102. The hard mask 105 is a stacked layer formed through sequentially depositing a nitride layer 103 and an oxide layer 104. The nitride layer 103 is formed of a silicon nitride such as $Si_3N_4$ in a thickness ranging from approximately 1000 Å to approximately 2500 Å. The nitride layer 103 may be formed through a Low Pressure Chemical Vapor Deposition (LPCVD) to minimize a stress caused during the deposition process. The LPCVD process is performed at a temperature of approximately 700° C. to approximately 800° C., under a pressure of approximately 0.3 Torr to approximately 0.4 Torr using a diclorosilane (DCS) such as $SiCl_2H_2$ and ammonia ($NH_3$). The oxide layer 104 is formed of a silicon oxide ($SiO_2$) layer, in a thickness ranging from approximately 1000 Å to approximately 25000 Å. The oxide layer 104 may be formed to be an oxide layer like a High Density Plasma (HDP) layer, a High temperature Low pressure Dielectric (HLD) layer, or an Undoped Silicate Glass (USG). There is no limitation in above described thickness, temperature, and pressure, and they depend on a depth of a deep trench to be formed subsequently.

Figure 2B:
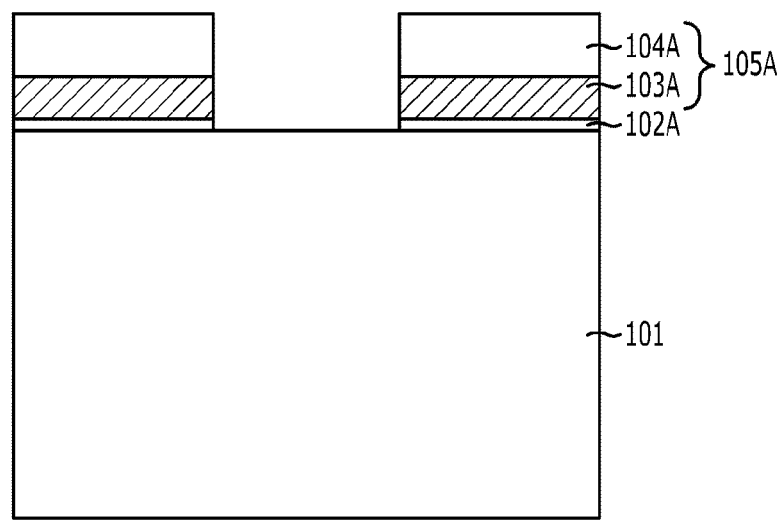

Referring to FIG. 2B, a photoresistive (PR) pattern (not shown) is formed over the oxide layer 104. The hard mask 105 and the buffer layer 102 are sequentially etched using the photoresistive (PR) pattern as an etch mask until a surface of the substrate 101 is exposed so that a buffer layer pattern 102A and a hard mask pattern 105A are formed over the substrate 101. The etching process is performed through a dry etching using tetrafluoromethane($CF_4$) and trifluoromethane ($CHF_3$) as a source gas. Subsequently, the photoresistive (PR) pattern (not shown) is removed.

Figure 2C:
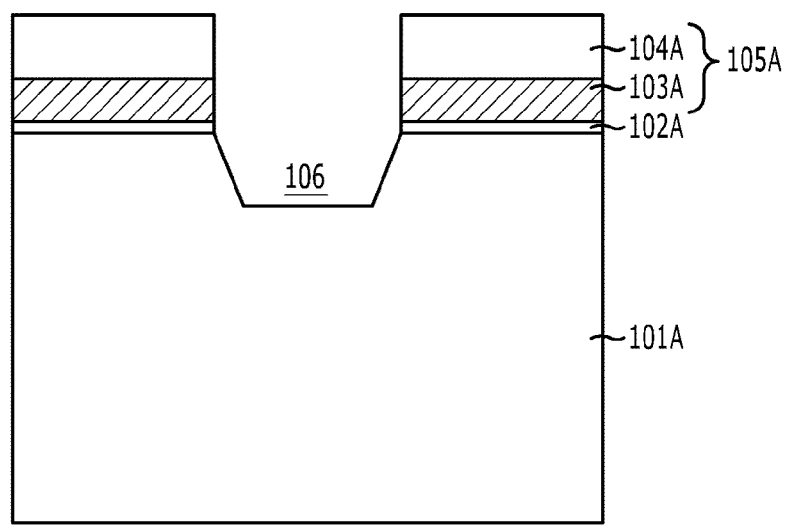

Referring to FIG. 2C, a first etching process is performed, the exposed portion of the substrate 101 in FIG. 2B is etched to a predetermined depth through a dry etching process so as to form a first trench 106 in the substrate 101A using the hard mask pattern 105A as an etch mask. The first trench 106 is formed to have a tilt angle of approximately 70° to approximately 85° between a bottom and an etched sidewall, and a depth of the first trench 106 ranges from approximately 5000 Å to approximately 10000 Å.

The first etching process is performed using an Inductive Coupled Plasma (ICP) device among several plasma etching devices. The first etching process is performed using a gas containing chloride and a gas containing bromide (Br) as a main gas to induce much polymer so as to have a predetermined tilt angle between the bottom and the etched sidewall of the first trench 106. The gas containing chloride includes any one selected from the group consisting of $Cl_2$, HCL, $SiC_4$, $CCl_4$, $BCl_3$, $PCl_3$, $CHCl_2F$, $CHClF_2$, $CCl_2F_2$ and ICl. The gas containing bromide (Br) includes any one selected from the group consisting of HBr, $CF_3Br$, $Br_2$ and IBr. Furthermore, $N_2$ or $O_2$ may be added as an additive gas in the first etching process.

An etching condition of the first etching process is described in the following Table 1. $Cl_2$ is used as the gas containing chloride, and HBr is used as the gas containing bromide.

TABEL 1

| Parameter | Pressure (Torr) | Top Bias (W) | Bottom bias (W) | Flow Rate(sccm) | | | |
|---|---|---|---|---|---|---|---|
| | | | | $N_2$ | $Cl_2$ | $O_2$ | HBr |
| Condition | 5~20 m | 300~600 | 100~200 W | 5~10 | 50~100 | 5~10 | 50~150 |

Figure 2D:
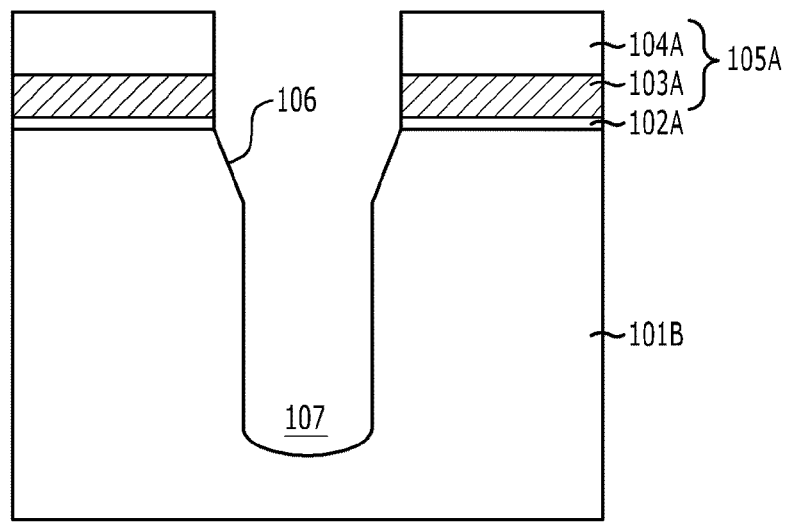

Referring to FIG. 2D, a second etching process is performed. The exposed portion of the substrate 101A in FIG. 2C is etched to a predetermined depth through a dry etching process so as to form a second trench 107 in the substrate 101B using the hard mask pattern 105A as an etch mask. An etched portion of the second trench 107 is formed to have a vertical profile. The second trench 107 is formed in a depth ranging from approximately 3 μm to approximately 100 μm, which is deeper than the first trench 106.

The second etching process is performed by employing an in-situ process in the same chamber as the first etching process. A main gas of the second etching process is a gas containing sulfur and fluorine such as sulfur hexafluoride ($SF_6$). The etching condition of the second etching process is described in the following Table 2.

TABEL 2

| Parameter | Pressure (Torr) | Top Bias (W) | Bottom bias (W) | Flow Rate(sccm) | |
|---|---|---|---|---|---|
| | | | | $SF_6$ | $O_2$ |
| Condition | 5~50 m | 500~800 | 50~200 | 5~10 | 50~150 |

Referring to Table 2, in a case of using $SF_6$ as a main gas, an under-cut may be caused according to an etching characteristic of the gas containing sulfur and fluorine. However, since much polymer is already formed in the sidewalls of the first trench 106, the under-cut is suppressed from occurring.

Figure 2E:
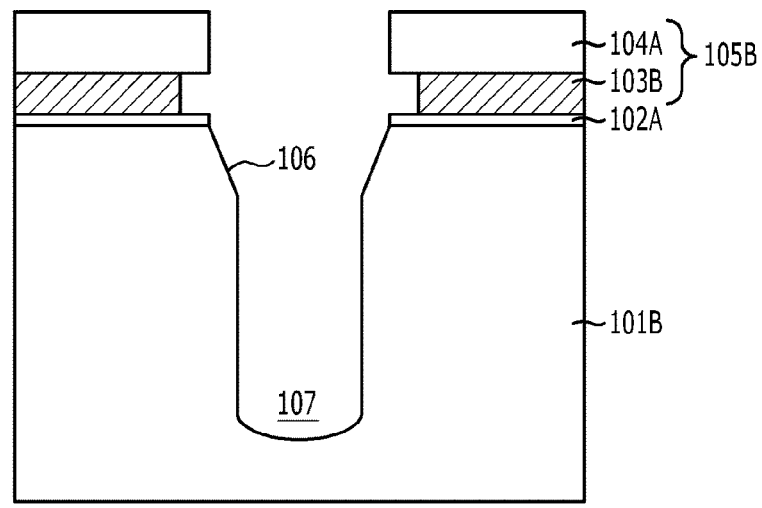

Referring to FIG. 2E, the nitride layer 103B of the hard mask pattern 105B is selectively recessed to thereby form a recess. The depth of the recess may range from approximately 100 Å to approximately 500 Å. The selective recessing process is performed through a wet etching process with a phosphoric acid solution such as $H_3PO_4$. The purpose of selectively recessing the nitride layer 103B is to improve subsequent burial characteristic by extending the opening portion of the first trench 106.

Meanwhile, before the selective recessing process, a sidewall protective layer (not shown) may be formed on an inner sidewall of the first trench 106 and the second trench 107 to prevent the substrate 101B from being directly exposed to a phosphoric acid solution such as $H_3PO_4$ and being damaged. The sidewall protective layer (not shown) may be an oxide layer formed through a deposition process or an oxide process including a dry type process and wet type process.

Figure 2F:
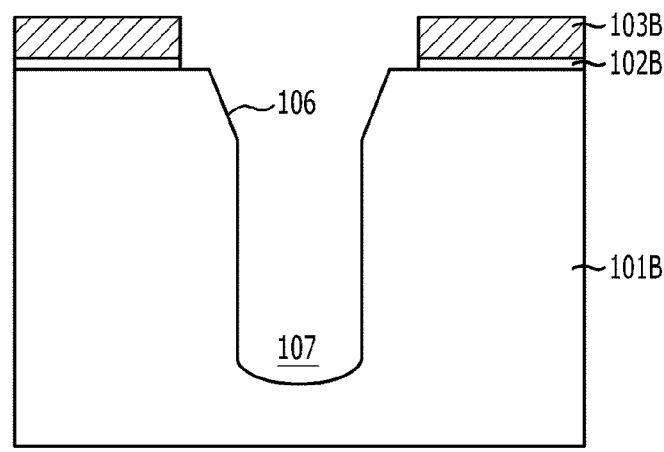

Referring to FIG. 2F, the oxide layer pattern 104A (see FIG. 2E) formed over the nitride layer 103B is removed. During the process, a portion of the buffer layer pattern 102B predetermined not covered by the nitride layer pattern 103B but exposed is also removed. The removal process is performed using any one of Diluted HF (DHF), Buffered HF (BHF) and Buffered Oxide Enchant (BOE).

Figure 2G:
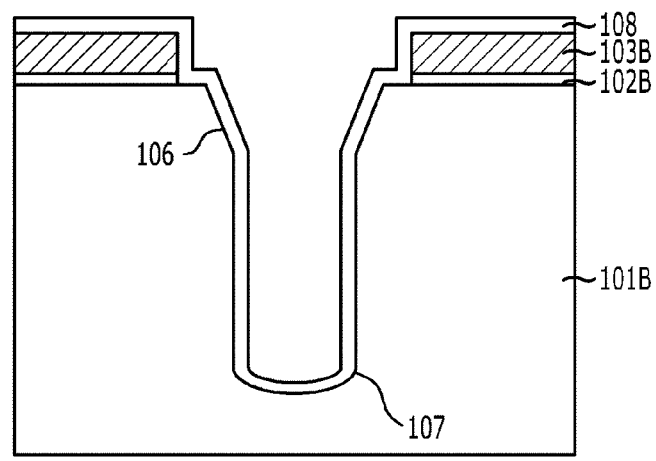

Referring to. FIG. 2G, a sidewall insulation layer 108 is formed along an inner sidewall of the first trench 106 and the second trench 107. The sidewall insulation layer 108 is formed as a single layer through an oxide process or a deposition process, or as a stack layer where a first layer formed through an oxide process and a second layer formed through a deposition process are stacked. When the sidewall insulation layer 108 is formed as the stack layer, the first layer is formed in a thickness ranging from approximately 100 Å to approximately 300 Å and the second layer is formed in a thickness ranging from approximately 1000 Å to approximately 2000 Å

Figure 2H:
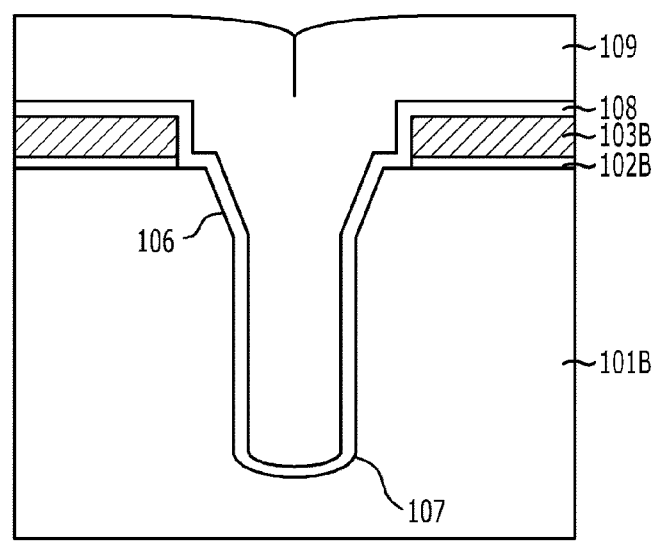

Referring to FIG. 2H, a device isolation layer 109 is formed to fill the first trench 106 and the second trench 107. The device isolation layer 109 may be formed to be an insulation layer, e.g., an oxide layer or a poly silicon layer. The device isolation layer 109 may be planarized through a planarization process, e.g., a Chemical Mechanical Polishing (CMP) although not shown in the drawing.

As described above the method of the present invention can be applied to the semiconductor device to improve burial characteristic the deep trench and to prevent a scallop phenomenon by forming the deep trench through two-step etching process using a different main gas for each etching step and an under-cut of the deep trench.

While the present invention has been described with respect to the specific embodiments, it will be apparent to those skilled in the art that various changes and modifications may be made without departing from the spirit and scope of the invention as defined in the following claims.

What is claimed is:

1. A method for forming a deep trench in a semiconductor device, comprising:
    forming a buffer layer over a substrate;
    forming a hard mask over the buffer layer, the hard mask comprising a nitride layer and an oxide layer;
    forming a hard mask pattern by etching the hard mask to thereby expose an upper portion of the substrate;
    forming a first trench in the exposed substrate by performing a first etching process using a gas containing bromide and a gas containing chloride;
    forming a second trench having a depth deeper than the first trench through a second etching process where the exposed substrate through a bottom portion of the first trench is etching using a gas containing sulfur and fluoride;
    forming a sidewall protective layer on an inner sidewall of the first and the second trenches;
    recessing the nitride layer;
    removing the oxide layer;
    forming a sidewall insulation layer along an inner surface of the first and second trenches after removing the oxide layer; and
    forming a device isolation layer to fill the first and the second trenches.

2. The method of claim 1, wherein the first and the second etching processes are performing in-situ.

3. The method of claim 1, wherein the gas containing chloride includes one selected from the group consisting of $Cl_2$, HCl, $SiCl_4$, $CCl_4$, $BCl_3$, $PCl_3$, $CHCl_2F$, $CHClF_2$, $CCl_2F_2$ and ICl.

4. The method of claim 1, wherein the gas containing bromide includes any one selected from the group consisting of HBr, $CF_3Br$, $Br_2$ and IBr.

5. The method of claim 1, wherein the first etching process is performed by adding an oxygen gas and a nitrogen gas.

6. The method of claim 5, wherein the first etching is performed by supplying the nitrogen gas at a flow rate of approximately 5 sccm to approximately 10 sccm, the gas containing chloride at a flow rate of approximately 50 sccm to approximately 100 sccm, the oxygen gas at a flow rate of approximately 50 sccm to approximately 100 sccm, and the gas containing bromide at a flow rate of approximately 50 sccm to approximately 150 sccm.

7. The method of claim 1, wherein the second etching process is performed by adding an oxygen gas.

8. The method of claim 7, wherein the second etching process is performed by supplying the gas containing sulfur and fluorine at a flow rate of approximately 20 sccm to approximately 200 sccm and the oxygen gas at a flow rate of approximately 20 sccm to approximately 100 sccm.

9. The method of claim 1, wherein the first trench has a tilt angle of approximately 70° approximately to 85° between a bottom and an etched sidewall.

10. The method of claim 1, wherein the first trench has a depth ranges from approximately 5000 Å to approximately 10000 Å.

11. The method of claim 1, wherein the second trench has a depth ranging from approximately 3 μm to approximately 100 μm.

12. The method of claim 1, wherein the buffer layer is an oxide layer.

13. The method of claim 1, wherein the second trench is formed to have more vertical profile than the first trench.

14. A method for forming a deep trench in a semiconductor device, comprising:
    forming a hard mask pattern over a substrate, the hard mask pattern comprising a nitride layer and an oxide layer;
    forming a first trench in the substrate by performing a first etching process;
    forming a second trench having a depth deeper and shallower than the first trench through a second etching process where the substrate through a bottom portion of the first trench is etched;
    forming a sidewall protective layer on an inner sidewall of the first and the second trenches;
    recessing the nitride layer;
    removing the oxide layer;
    forming a sidewall insulation layer along an inner surface of the first and second trenches after removing the oxide layer, the sidewall insulation layer comprising oxide layer; and
    forming a device isolation layer to fill the first and second trenches, the device isolation layer comprising poly silicon layer;
    wherein the first trench has a tilt angle of approximately 70° approximately to 85° between a bottom and the etched sidewall.

15. The method of claim 14, wherein a polymer is formed over an etched sidewall of the first trench during the first etching process and the polymer prevents an under-cut in an upper portion and the sidewall of the deep trench.

16. The method of claim 14, wherein the first etching process uses a gas containing bromide and chloride.

17. The method of claim 14, wherein the second etching process uses a gas containing sulfur and fluoride and oxygen.

18. The method of claim 14, wherein the first trench has a depth ranging from approximately 5,000 Å to approximately 10,000 Å.

19. The method of claim 14, wherein the second trench has a depth ranging from approximately 3 μm to approximately 100 μm.

20. The method of claim 14, wherein the sidewall insulation layer is a stack layer where a first layer formed through an oxide process and a second layer formed through a deposition process are stacked, sequentially.

21. The method of claim 1, wherein the sidewall protective layer comprises an oxide layer.

22. The method of claim 14, wherein the sidewall protective layer comprises an oxide layer.

* * * * *